United States Patent
Tiwary et al.

(10) Patent No.: US 10,789,401 B1
(45) Date of Patent: Sep. 29, 2020

(54) FOLDING MULTIPLY-AND-ACCUMULATE LOGIC

(71) Applicant: Xilinx, Inc., San Jose, CA (US)

(72) Inventors: Srijan Tiwary, Rajnandgaon (IN); Aman Gayasen, Hyderabad (IN); Kumar S. S. Vemuri, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/294,520

(22) Filed: Mar. 6, 2019

(51) Int. Cl.
  *G06F 30/30* (2020.01)
  *G06F 30/327* (2020.01)
  *G06F 7/544* (2006.01)
  *G06F 9/30* (2018.01)
  *G06F 30/33* (2020.01)
  *G06F 30/398* (2020.01)

(52) U.S. Cl.
  CPC .......... *G06F 30/327* (2020.01); *G06F 7/5443* (2013.01); *G06F 9/3001* (2013.01); *G06F 30/33* (2020.01); *G06F 30/398* (2020.01)

(58) Field of Classification Search
  CPC ...... G06F 30/398; G06F 30/33; G06F 9/3001; G06F 30/327
  USPC ................................................. 716/101, 104
  See application file for complete search history.

(56) References Cited

U.S. PATENT DOCUMENTS

| | | | | |
|---|---|---|---|---|
| 5,854,929 A * | 12/1998 | Van Praet et al. | ...... | G06F 30/30 717/156 |
| 5,918,035 A * | 6/1999 | Van Praet et al. | ........ | G06F 8/41 703/22 |
| 6,477,683 B1 * | 11/2002 | Killian et al. | ............ | G06F 8/41 716/106 |
| 6,760,888 B2 * | 7/2004 | Killian et al. | .......... | G06F 30/30 716/102 |
| 7,765,506 B2 * | 7/2010 | Oktem et al. | ........... | G06F 30/34 716/103 |
| 7,844,796 B2 * | 11/2010 | Vorbach et al. | .... | G06F 15/7867 712/18 |
| 8,145,881 B2 * | 3/2012 | Vorbach et al. | .... | G06F 15/7867 712/18 |
| 8,489,376 B2 * | 7/2013 | Schaub et al. | .......... | G06F 30/33 703/13 |
| 8,812,820 B2 * | 8/2014 | Vorbach et al. | .... | G06F 15/7867 712/15 |
| 9,225,808 B1 * | 12/2015 | Dropps | ................... | H04L 69/28 |

(Continued)

*Primary Examiner* — Sun J Lin
(74) *Attorney, Agent, or Firm* — Crawford Maunu PLLC

(57) ABSTRACT

Approaches for folding multiply-and-accumulate (MAC) logic in a circuit design involve a design tool recognizing a first instance of the MAC logic and a second instance of the MAC logic. The design tool replaces the first instance of the MAC logic and the second instance of the MAC logic with one instance of pipelined MAC logic. The design tool configures the pipelined MAC logic to input data signals of the first instance of the MAC logic and the second instance of the MAC logic to the pipelined MAC logic at a first clock rate, and switch between selection of the data signals of the first instance of the MAC logic and the second instance of the MAC logic at a second clock rate that is double the first clock rate. The design tool further configures the pipelined MAC logic to pipeline input data signals at the second clock rate, and to capture intermediate results at the second clock rate. The design tool further configures a register to capture output of the pipelined MAC logic at the first clock rate.

20 Claims, 7 Drawing Sheets

(56) References Cited

U.S. PATENT DOCUMENTS 9,875,330 B2 1/2018 Ganusov
2017/0102950 A1* 4/2017 Chamberlain et al. ..................... G06F 3/067

* cited by examiner

FOLDING MULTIPLY-AND-ACCUMULATE LOGIC

TECHNICAL FIELD

The disclosure generally relates to folding multiply-and-accumulate logic of a circuit design.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Recognizing that there is a finite number of DSPs available on an FPGA, experienced designers may choose to fold logic implemented on two DSPs into one time-multiplexed DSP. A circuit designer can specify the controls and circuit structures for time-multiplexing a DSP in a circuit design. However, specifying register transfer language (RTL) for time-multiplexing a DSP requires considerable effort of the designer and can be prone to error.

SUMMARY

A disclosed method includes recognizing by a design tool executing on a computer processor, a first instance and a second instance of multiply-and-accumulate (MAC) logic in a circuit design, the first instance inputting first data signals and the second instance inputting second data signals. The method has the design tool replacing the first instance and the second instance of the MAC logic in the circuit design with one instance of pipelined MAC logic. In performing the method, the design tool configures the one instance of pipelined MAC logic by the design tool to input the first data signals and the second data signals to the one instance of pipelined MAC logic at a first clock rate, and switch between selection of the first data signals and the second data signals at a second clock rate that is double the first clock rate. The design tool further configures the one instance of pipelined MAC logic to pipeline at the second clock rate, select data signals of the first data signals and the second data signals, and capture intermediate results generated by the one instance of pipelined MAC logic at the second clock rate. The design tool further configures a register to capture output of the pipelined MAC logic at the first clock rate.

A disclosed system includes a processor and a memory arrangement coupled to the processor. The memory arrangement is configured with instructions and in response to execution of the instructions, the processor performs operations of recognizing a first instance and a second instance of multiply-and-accumulate (MAC) logic in a circuit design. The first instance inputs first data signals and the second instance inputs second data signals. Execution of the instructions further cause the processor to replace the first instance and the second instance of the MAC logic in the circuit design with one instance of pipelined MAC logic. The processor in response to executing the instructions further configures features of the one instance of pipelined MAC logic. The features include input of the first data signals and the second data signals to the one instance of pipelined MAC logic at a first clock rate, switching between selection of the first data signals and the second data signals at a second clock rate that is double the first clock rate, pipelining at the second clock rate, selected data signals of the first data signals and the second data signals, and capturing intermediate results generated by the one instance of pipelined MAC logic at the second clock rate. The processor further configures, in executing the instructions, a register to capture output of the pipelined MAC logic at the first clock rate.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

Figure 1:
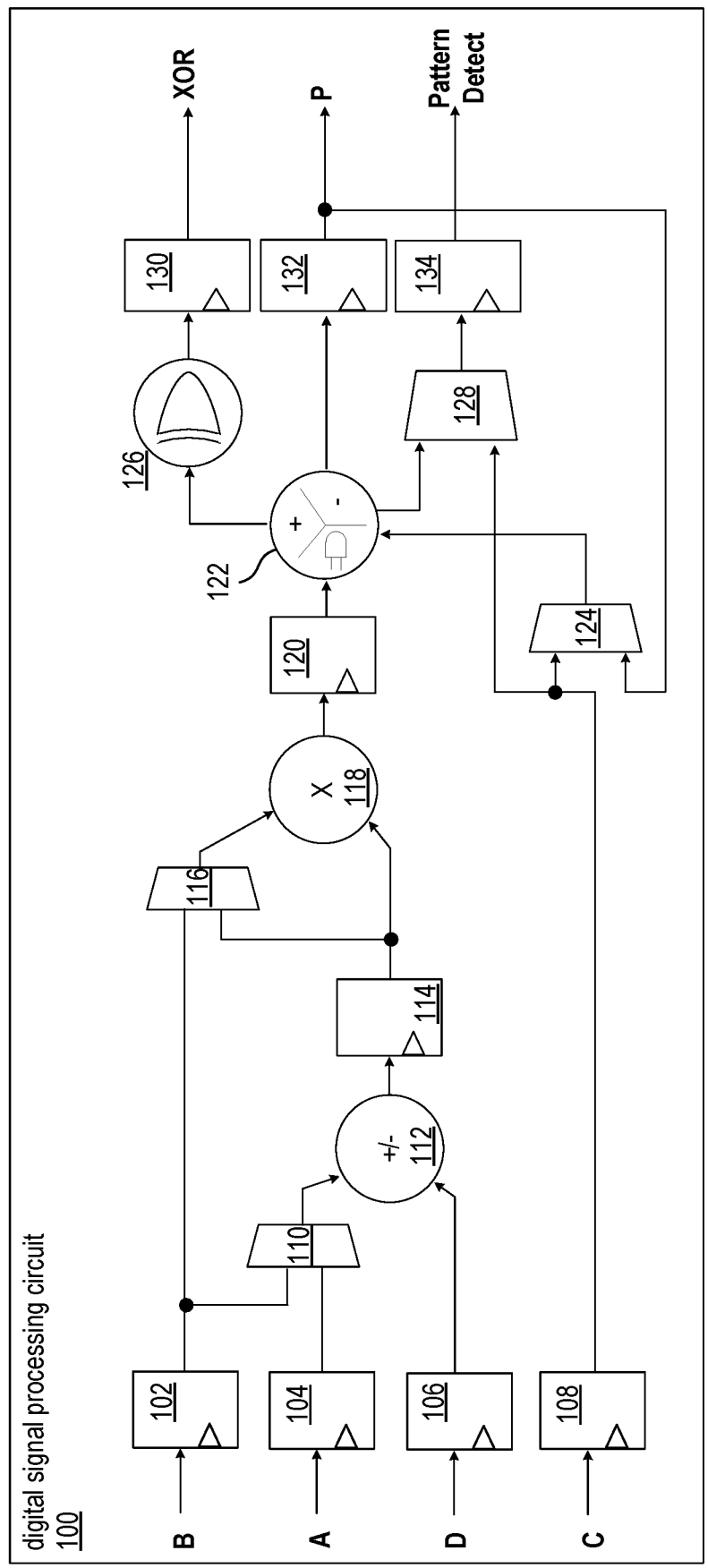
FIG. 1 shows an exemplary digital signal processing (DSP) circuit that is configurable to time-multiplex DSP functions.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed approaches relate to a design tool recognizing opportunities to time-multiplex DSPs and automatically folding multiply-and-accumulate logic specified on a pair of DSP circuits into a single time-multiplexed DSP circuit. The design tool automatically generates a faster clock signal for the time-multiplexed DSP circuit and schedules input of the control and data signals.

DSP circuits are configurable to implement multiply-and-accumulate functions, and the disclosed approaches improve circuit designs by reducing the number of DSP circuits required and reducing the time required to design a circuit through the automated identification of multiply-and-accumulate logic that can be folded into time-multiplexed DSP logic. The circuit design tool recognizes first and second instances of multiply-and-accumulate (MAC) logic that are eligible for folding in a circuit design. The design tool replaces the first and second instances of the MAC logic in the circuit design with one instance of pipelined MAC logic. The pipelined MAC logic is configured to operate in a time-multiplexed manner and replace the computations of the first and second instances of the MAC logic. The design tool configures the pipelined MAC logic to input data signals of the first instance of MAC logic and input data signals of the second instance of MAC logic at a first clock rate. The design tool further configures the pipelined MAC logic to switch between selection of the first data signals and the second data signals at a second clock rate that is double the rate of the first clock rate. The selected data signals are pipelined at the second clock rate, and the pipelined MAC logic captures intermediate results at the second clock rate. The design tool configures a capture register to capture the output of the pipelined MAC logic at the first clock rate.

The disclosed processes can improve the way a computer system operates in processing circuit designs. By folding instances of MAC logic into a single time-multiplexed DSP circuit, fewer memory resources are used by the design tool in representing the circuit design for synthesis, mapping, place-and-route, optimization, and simulation processes. In addition, processing cycles of the computer system hosting design tools are reduced as a result of having to process fewer DSP circuits in the design flow. Performing two MACs in one DSP instance allows twice the number of MAC operations to be performed on the same programmable IC, which can improve the throughput of applications previously limited by MAC resources.

FIG. 1 shows an exemplary digital signal processing (DSP) circuit 100 that is configurable to time-multiplex DSP functions. The exemplary DSP is configurable to perform multiply-and-accumulate, multiply-and-subtract, and multiply-and-AND functions. Input data values A, B, C, and D are stored in registers 102, 104, 106, and 108. The value of B stored in register 102 and the value of A stored in register 104 are input to multiplexer 110. The control signal to the multiplexer can be provided by the signal from a configuration memory cell (not shown).

Circuit 112 is configurable to add or subtract the value output by multiplexer 110 and the input value D from register 106. The output of circuit 112 is stored in register 114. Multiplexer 116 selects one of the values from registers 102 and 114, and the selection can be controlled by the state of a configuration memory cell (not shown). Multiplier circuit 118 multiplies the output signal of multiplexer 116 with the value output by register 114, the result of which is stored in register 120.

Also shown in FIG. 1 is multiplexer 124, having as inputs the value of C stored in register 108 and a value fed back from output signal P. To generate output signal P, accumulator 122 receives as inputs the value stored in register 120 and the value output by multiplexer 124. The accumulator circuit 122 is configurable to perform one of an addition function, a subtraction function, or an AND function. The accumulator circuit 122 can be configured by way of one or more configuration memory cells associated with the DSP circuit 100. Register 132 stores the value output by accumulator 122 and generates output signal P, which in turn is fed back to multiplexer 124.

Also in accordance with FIG. 1, the value output by accumulator 122 may undergo an XOR 126 operation before being stored in register 130 and used to generate output signal XOR. Multiplexer 128 can operate as a pattern detector, selecting either the value output by accumulator 122 or the input data value of C from register 108. The output of multiplexer 128 is stored in register 134, which provides the output signal "pattern detect."

Figure 2:
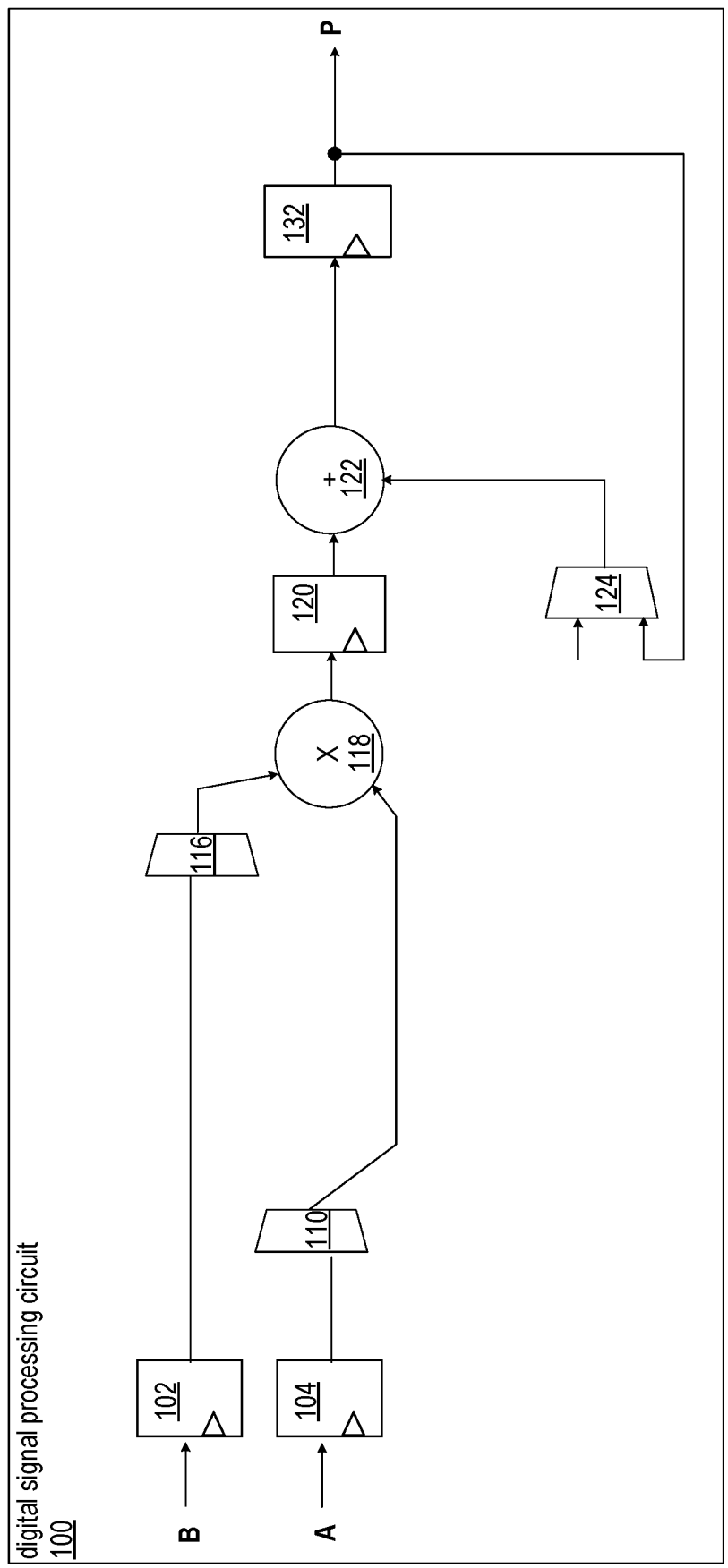
FIG. 2 shows the DSP circuit of FIG. 1 configured to operate as a multiply-and-accumulate circuit in which the accumulate function is addition.

FIG. 2 shows the DSP circuit 100 of FIG. 1 configured to operate as a multiply-and-accumulate circuit in which the accumulate function is addition. Registers 102 and 104 store input values B and A respectively. The value of B stored in register 102 is input to multiplexer 116, and the value of A stored in register 104 is input to multiplexer 110. Multiplier circuit 118 multiplies the values output by multiplexers 110 and 116, and the result is stored in register 120. Multiplexer 124 is configured to select the value fed back from output signal P; the selection can be controlled by the state of a configuration memory cell (not shown). Accumulator 122 is configured to perform an addition function and adds the value stored in register 120 to the feedback value selected by multiplexer 124. The value resulting from the addition is stored in register 132, and the value from register 132 is used to generate output signal P.

Figure 3:
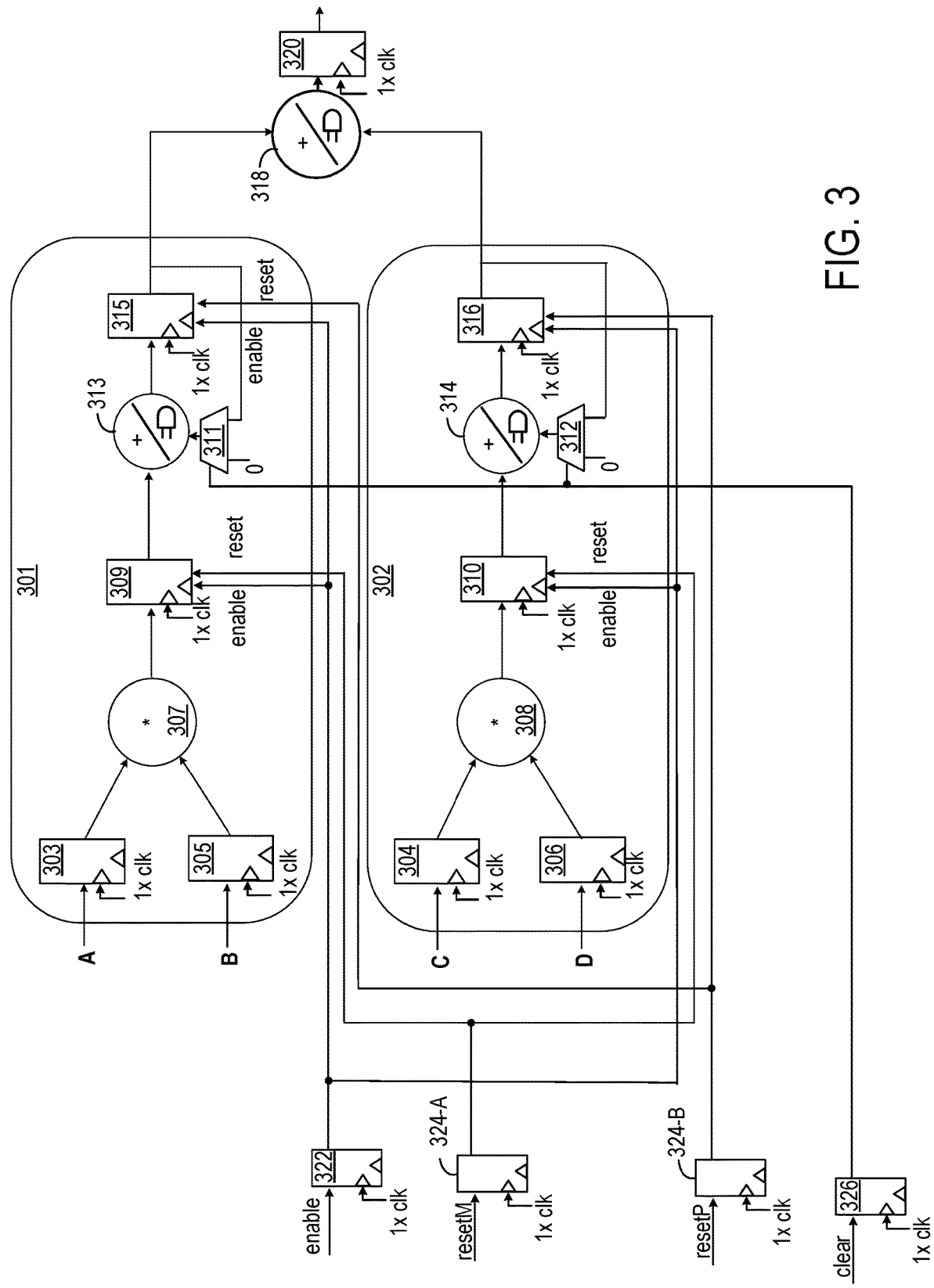
FIG. 3 shows exemplary instances of multiply-and-accumulate logic that qualifies to be folded into a single DSP circuit.

FIG. 3 shows exemplary multiply-and-accumulate logic that qualifies to be folded into a single DSP circuit. DSP circuit 301 receives as inputs data values A and B from registers 303 and 305. The values of A and B as stored in registers 303 and 305 are input to multiplier 307, and the product is stored in register 309. Accumulator 313 performs an accumulation function on the value stored in register 309 and the value selected by multiplexer 311. The result of the accumulation function is stored in register 315. The accumulation function can be one of addition or a logic AND of the two inputs. In general, in order to qualify for folding the accumulation function can be any function that is commutative and associative. The value output by register 315 is accumulated with the output of DSP circuit 302 by configurable accumulator 318 and the result is stored in register 320.

DSP circuit 302 receives as inputs data values C and D from registers 304 and 306. The values of C and D are input to multiplier 308, and the product is stored in register 310. Accumulator 314 performs an accumulation function on the value stored in register 310 and the value selected my multiplexer 312. The result of the accumulation function is stored in register 316. The accumulation function of accumulator 314 is the same as the accumulation function of accumulator 313. The value output by register 316 from DSP circuit 302 is accumulated with the output of DSP circuit 301 by configurable accumulator 318, and the accumulation function of accumulator 318 is the same as the accumulation functions of accumulators 313 and 314.

In order to qualify for logic folding, DSP circuits 301 and 302 are configured as identical DSP circuits operating on different input data values. Data values A and B are the inputs of DSP circuit 301, and data values C and D are input into DSP circuit 302. To qualify for logic folding, the accumulation function of accumulators 313 and 314 are the same. The outputs of DSPs 301 and 302 are combined by accumulator 318, which is configured to perform the same accumulation function as accumulators 313 and 314 of in the DSP circuits. For example, if accumulators 313 and 314 are configured to perform addition, the resulting values are summed by accumulator 318.

The values of an enable signal and reset signals are stored in registers 322, 324A, and 324B, respectively. The reset and enable signals together implement a control path and are shared between DSPs 301 and 302 at intermediate registers 309, 310, 315, and 316. The shared control path is one of the features required for DSP logic to qualify for logic folding. That is, the enable signal from register 322 is provided to both registers 309 and 310, as well as to registers 315 and 316; resetM signal from register 324A is provided to both registers 309 and 310; and resetP signal from register 324B is provided to both register 315 and register 316.

Also depicted in FIG. 3 is a clear signal, the value of which is stored in register 326. The clear signal is routed to multiplexers 311 and 312. In response to deassertion of the clear signal, the multiplexers select a fixed 0 value instead of the feedback values from registers 315 and 316.

Figure 4:
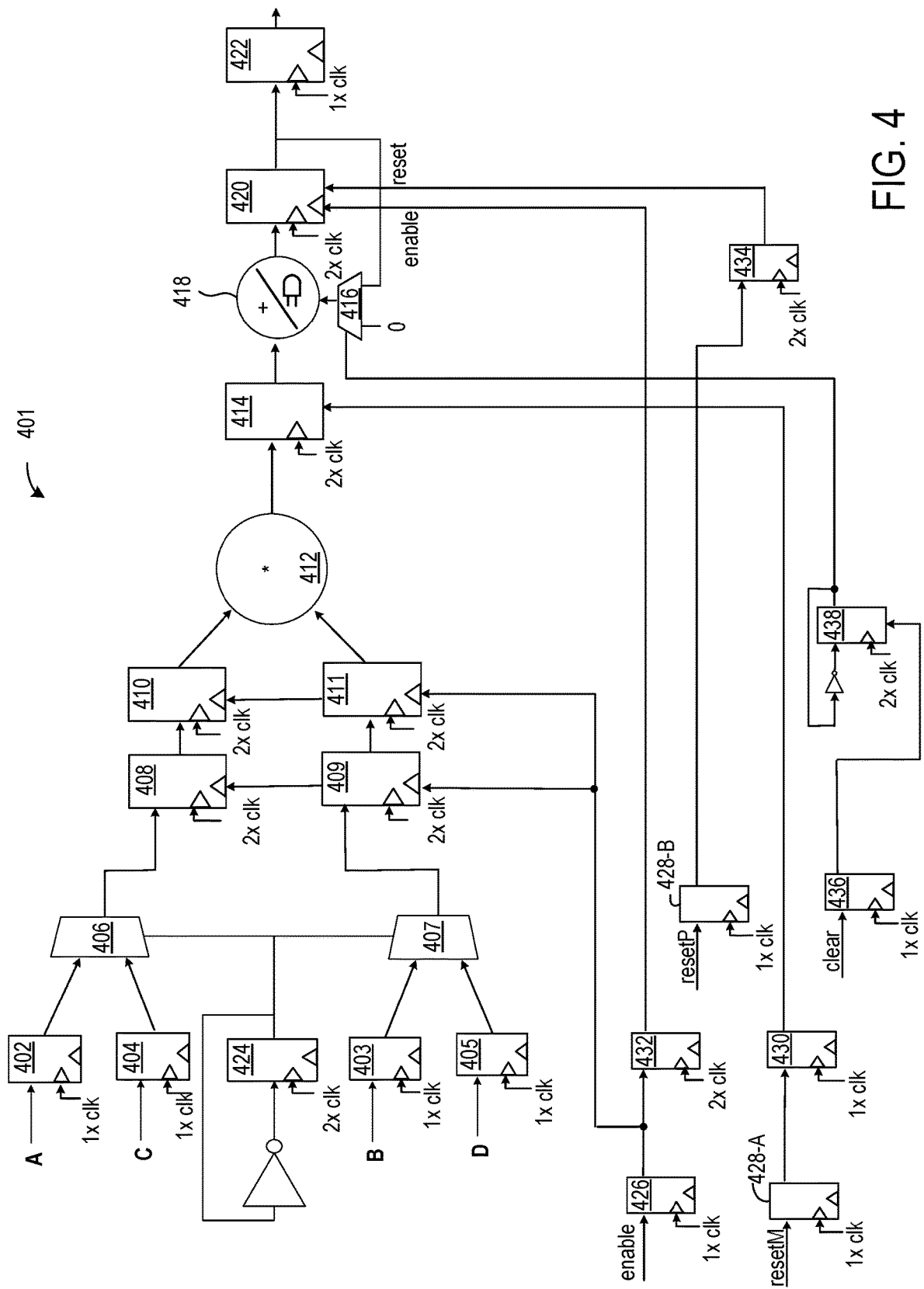
FIG. 4 shows a DSP circuit configured to time-multiplex two multiply-and-accumulate functions.

FIG. 4 shows a DSP circuit 401 configured to time-multiplex two multiply-and-accumulate (MAC) functions. The DSP circuit 401 operates at twice the clock rate (a frequency of 2×) of the DSP circuits 301 and 302 in FIG. 3 and alternates between performing a MAC function on the input data values A and B and a MAC function on the input data values C and D. Input data values A, B, C, and D are stored in registers 402, 403, 404, and 405, respectively. The value of A stored in register 402 along with the value of C stored in register 404 provide the inputs to multiplexer 406, and the value of B stored in register 403 and the value of D stored in register 405 provide the inputs to multiplexer 407. The control signal to multiplexers 406 and 407 is provided by register 424, which is clocked at twice the clock speed at which the registers 402, 403, 404, and 405 are clocked. On one cycle of the 2× clock signal, multiplexers 406 and 407 select the input value A from register 402 along with input value B stored in register 403. In the next successive cycle of the 2× clock signal, multiplexers 406 and 407 select input value C from register 404 and input value D from register 405.

DSP circuit 401 has registers 408, 409, 410, and 411 that are configured to pipeline input data values. The registers 408, 409, 410, and 411 are clocked at twice the rate at which the registers 402, 403, 404, and 405 are clocked. In one cycle of the 2× clock signal, the input data values selected by the multiplexers 406 and 407 are stored in registers 408 and 409. In the next cycle of the 2× clock signal, the data values in registers 408 to 409 are shifted into registers 410 and 411 so that the other pair of input data values selected by the multiplexers 406 and 407 can be stored in the registers 408 and 409.

The data values from registers 410 and 411 are input to multiplier circuit 412, and the output of the multiplier circuit is stored in register 414, which is clocked at twice the rate of the registers 402, 403, 404, and 405. The value output by register 414 is input to the accumulator 418. The accumulator 418 performs an accumulation function on the value from the register 414 and the value selected by multiplexer 416, which is one of a feedback value from register 420 or a constant value 0. The accumulation function may be one of addition or a logic AND. The result of the accumulation function is stored in register 420, which is clocked at twice the rate at which registers 402, 403, 404, and 405 are clocked. The output of register 420 is captured in register 422, which is operated at a clock signal frequency of 1×.

The value of the enable signal is stored in register 426, which is clocked at the 1× clock speed, and the output of register 426 is provided as the enable input to flip-flops 408, 409, 410, and 411. The value of the enable signal output by register 426 is also stored in register 432, which is clocked by the clock signal having the frequency of 2×, and the output of register 432 is provided as the enable signal for controlling register 420.

The value of the signal resetM is stored in register 428-A, which is clocked at the frequency of 1×. The output of register 428-A is buffered in register 430, which is clocked at the frequency of 1×. The buffered resetM signal from register 430 is provided as the reset signal to register 414. The value of the signal resetP is stored in register 428-B, which is clocked at the frequency of 1×. The output of register 428-B is buffered in register 434, which is clocked at the frequency of 2×. The buffered resetP signal from register 434 is provided as the reset signal to register 420. Resets of registers 408, 409, 410, and 411 are unused after folding.

The value of the clear signal is stored in register 436, which is operated at the clock frequency of 1×. The output of register 436 is input as the set signal to register 438, which is operated at the clock frequency of 2× and whose value toggles at the clock frequency of 2× in response to deassertion of the set signal. When the set signal is asserted the value will remain static to 1. The output signal from register 438 is provided as the control signal to multiplexer 416, which selects the constant value 0 or the feedback signal from register 420 in response to the state of the control signal.

Figure 5:
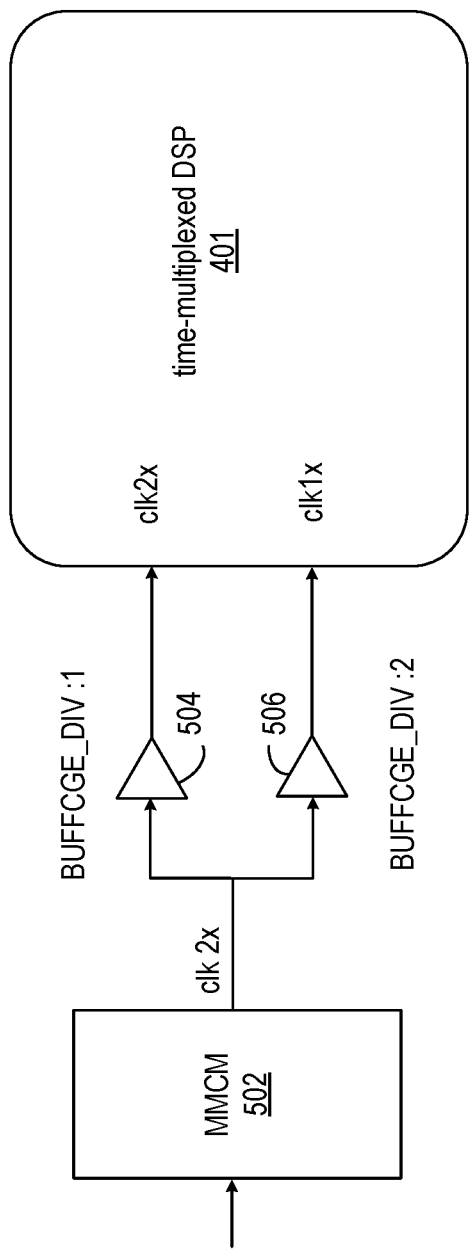
FIG. 5 shows logic that provides clock signals having frequencies of 1× and 2× to a time-multiplexed DSP circuit.

FIG. 5 shows logic that provides clock signals having frequencies of 1× and 2× to a time-multiplexed DSP circuit 401. In an exemplary application, a multi-mode clock manager (MMCM) 502 can be used to generate the clock signals for time-multiplexing a DSP circuit. For example, in FPGAs from XILINX, Inc., the MMCM is a primitive design object that is configurable to generate multiple clock signals having defined phase and frequency relationships to a given input clock signal.

The circuit design tool can determine whether or not an MMCM is present in the circuit design. If an MMCM is present in the circuit design, the design tool can specify configuration of the MMCM 502 to generate and output a dock signal having a frequency of 2×. The design tool configures the MMCM to drive one clock buffer with clock dividing factor set to 2(BUFCGE_DIV:2) 504 to output a clock signal having the frequency of 1× and another dock buffer with clock dividing factor set to 1 (BUFGE_DIV:1) 506 to output a clock signal having a frequency of 2×. If no MMCM is present in the circuit design, the circuit design tool instantiates and configures an MMCM to take 1× frequency clock as input and generate 2x frequency clock as described above.

Figure 6:
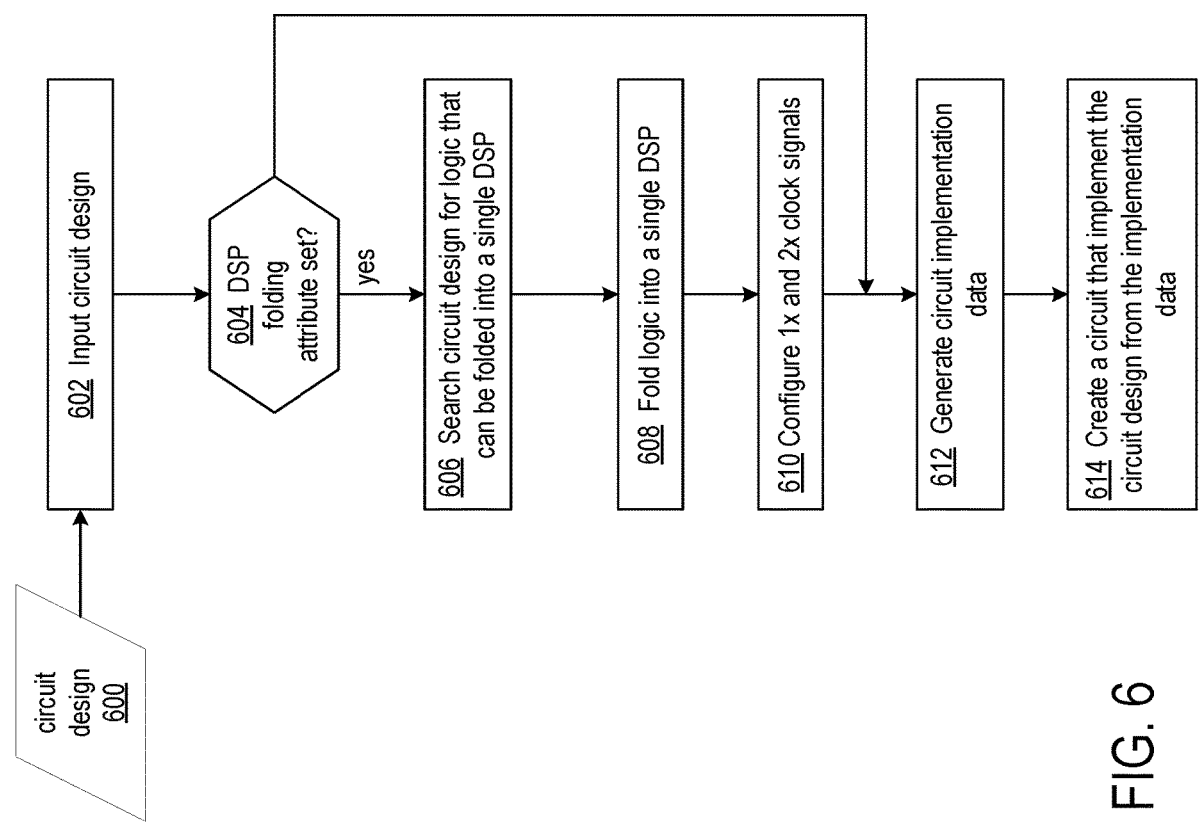
FIG. 6 is a flowchart of an exemplary process for automatically folding two instances of multiply-and-accumulate logic specified in a circuit design into a single time-multiplexed DSP circuit.

FIG. 6 is a flowchart of an exemplary process for automatically folding multiply-and-accumulate logic specified in a circuit design 600 into a single time-multiplexed DSP circuit. A design tool inputs the circuit design 600 at block 602. According to one feature, an attribute can be associated with the circuit design to turn on and turn off automatic folding. The attribute can be embedded in the circuit design 600 or specified as a command parameter, for example.

If the folding attribute is set, decision block 604 directs the design tool to block 606, at which the design tool searches for multiply-and-accumulate logic that can be folded into a single DSP circuit. For two instances of multiply-and-accumulate logic to quality for folding, the instances must share enable, reset, and clear signals as described above. In addition, the output values of the instances must be combined with an accumulate function that matches the accumulate functions of the two instances.

In response to finding two instances of multiply-and-accumulate logic that qualify for folding, at block 608 the design tool folds the instances into a single instance of time-multiplexed multiply-and-accumulate logic. The one instance of time-multiplexed multiply-and-accumulate logic can be as shown by the circuitry of FIG. 4.

At block 610, the design tool specifies logic that generates one clock signal having a frequency of 1×, and another clock signal having a frequency of 2×. The design tool connects the 1× and 2× clock signals to the registers of the DSP circuitry as shown in FIG. 4.

The design tool at block 612 generates circuit implementation data. The tool can perform synthesis of a hardware description language (HDL) specification of the circuit design, technology mapping, place-and-route, optimization processes, and simulations. The circuit implementation data can be a configuration bitstream for programmable logic or data that specifies fabrication details for an ASIC, for example. At block 614, a circuit can be implemented and made by way of configuring a programmable IC with a configuration bitstream, or fabricating, making, or producing an ASIC from the implementation data, thereby creating a circuit that operates according to the resulting circuit design.

Figure 7:
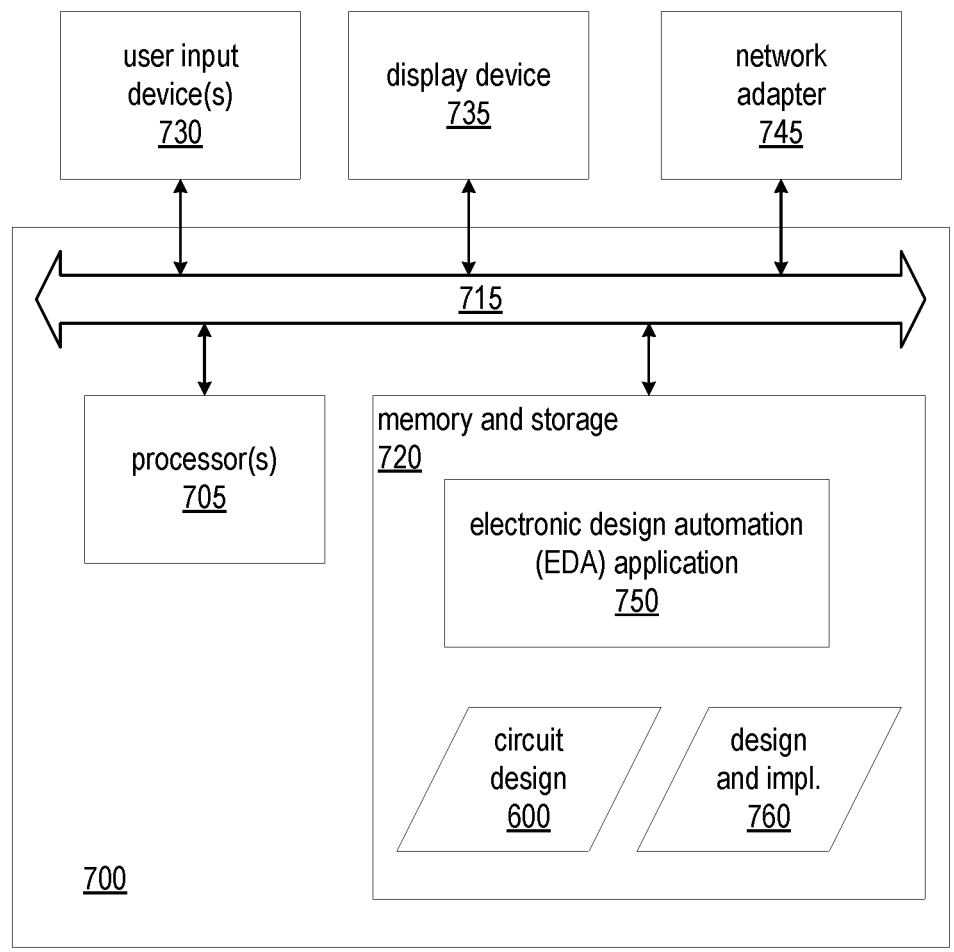
FIG. 7 is a block diagram illustrating an exemplary data processing system.

FIG. 7 is a block diagram illustrating an exemplary data processing system (system) 700. System 700 is an example of an EDA system. As pictured, system 700 includes at least one processor circuit (or "processor"), e.g., a central processing unit (CPU) 705 coupled to memory and storage arrangement 720 through a system bus 715 or other suitable circuitry. System 700 stores program code and circuit design 600 within memory and storage arrangement 720. Processor 705 executes the program code accessed from the memory and storage arrangement 720 via system bus 715. In one aspect, system 700 is implemented as a computer or other data processing system that is suitable for storing and/or executing program code. It should be appreciated, however, that system 700 can be implemented in the form of any system including a processor and memory that is capable of performing the functions described within this disclosure.

Memory and storage arrangement 720 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 700 may also include one or more cache memories (not shown) that provide temporary storage of at least some program code and data in order to reduce the number of times program code and data must be retrieved from local memory and persistent storage during execution.

Input/output (I/O) devices such as user input device(s) 730 and a display device 735 may be optionally coupled to system 700. The I/O devices may be coupled to system 700 either directly or through intervening I/O controllers. A network adapter 745 also can be coupled to system 700 in order to couple system 700 to other systems, computer systems, remote printers, and/or remote storage devices through intervening private or public networks. Modems, cable modems, Ethernet cards, and wireless transceivers are examples of different types of network adapter 745 that can be used with system 700.

Memory and storage arrangement 720 can store an EDA application 750. EDA application 750, being implemented in the form of executable program code, includes one or more design tools that are is executed by processor(s) 705. As such, EDA application 750 is considered part of system 700. System 700, while executing EDA application 750, receives and operates on circuit design 600. In one aspect, system 700 performs a design flow on circuit design 600, and the design flow can include the automated folding of multiply-and-accumulation logic, synthesis, mapping, placement, routing, optimization, simulation, and generation of implementation data. System 700 generates a modified version of circuit design 600 and generates implementation data, which are shown as circuit design and implementation data 760.

EDA application 750, circuit design 600, circuit design 760, and any data items used, generated, and/or operated upon by EDA application 750 are functional data structures that impart functionality when employed as part of system 700 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for folding multiply-and-accumulate logic. Other aspects and features will be apparent to those skilled in the art from consideration of the specification. It is intended that the specification and drawings be considered as examples only, with a true scope of the invention being indicated by the following claims.

What is claimed is:

1. A method comprising:
    recognizing, by a design tool executing on a computer processor, a first instance and a second instance of multiply-and-accumulate (MAC) logic in a circuit design, the first instance inputting first data signals and the second instance inputting second data signals;
    replacing, by the design tool, the first instance and the second instance of the MAC logic in the circuit design with one instance of pipelined MAC logic;
    configuring the one instance of the pipelined MAC logic by the design tool to:
        input the first data signals and the second data signals to the one instance of the pipelined MAC logic at a first clock rate,
        switch between selection of the first data signals and the second data signals at a second clock rate that is double the first clock rate,
        pipeline, at the second clock rate, selected data signals of the first data signals and the second data signals, and
        capture intermediate results generated by the one instance of the pipelined MAC logic at the second clock rate; and
    configuring a register to capture output of the pipelined MAC logic at the first clock rate.

2. The method of claim 1, wherein:
the recognizing includes determining whether or not the circuit design accumulates output of the first instance of the MAC logic with output of the second instance of the MAC logic; and
the replacing includes replacing the first instance and the second instance of the MAC logic with the one instance of the pipelined MAC logic in response to determining that the circuit design accumulates output of the first instance of the MAC logic with output of the second instance of the MAC logic.

3. The method of claim 2, wherein the recognizing includes determining whether or not a first accumulate function by which the circuit design accumulates output of the first instance of the MAC logic with output of the second instance of the MAC logic is equivalent to a second accumulate function implemented by the first instance of the MAC logic and to a third accumulate function of the second instance of the MAC logic.

4. The method of claim 3, wherein the first accumulate function is a commutative and associative function.

5. The method of claim 3, wherein the first accumulate function is one of addition logic or AND logic.

6. The method of claim 3 wherein:
the first instance of the MAC logic specifies a first register that captures output of a multiplication circuit of the first instance of the MAC logic and a second register that captures output of an accumulation circuit of the first instance of the MAC logic;
the second instance of the MAC logic specifies a third register that captures output of a multiplication circuit of the second instance of the MAC logic and a fourth register that captures output of an accumulation circuit of the second instance of the MAC logic; and
the recognizing includes determining whether or not the first register, the second register, the third register, and the fourth register share an enable signal and a reset signal.

7. The method of claim 6 wherein:
the one instance of the pipelined MAC logic includes a multiplication circuit, a fifth register that captures output of the multiplication circuit, an accumulation circuit, and a sixth register that captures output of the accumulation circuit and that is responsive to the enable signal and the reset signal;
the configuring the one instance of the pipelined MAC logic includes configuring the one instance of the pipelined MAC logic to:
pipeline the enable signal to the sixth register through a seventh register clocked at the second clock rate; and
pipeline the reset signal to the sixth register through an eighth register clocked at the second clock rate.

8. The method of claim 7, wherein:
the configuring the one instance of the pipelined MAC logic includes configuring the one instance of the pipelined MAC logic to:
pipeline the enable signal to the fifth register through the seventh register; and
pipeline the reset signal to the fifth register through a ninth register clocked at the first clock rate.

9. The method of claim 8, wherein the configuring the one instance of the pipelined MAC logic includes configuring the one instance of the pipelined MAC logic to pipeline at the second clock rate, selected data signals of the first data signals and the second data signals includes:

configuring the one instance of the pipelined MAC logic by the design tool to:
pipeline the first data signals and the second data signals through first pipeline registers and second pipeline registers; and
enable the first pipeline registers and the second pipeline registers with the enable signal.

10. The method of claim 8, wherein the configuring the one instance of the pipelined MAC logic includes configuring a selector to select between input of a constant zero value and an output value from the sixth register for input to the accumulation circuit.

11. The method of claim 1, further comprising instantiating in the circuit design a clock module configured to generate a first clock signal to operate at the first clock rate and a second clock signal to operate at the second clock rate.

12. The method of claim 1, wherein the recognizing includes determining whether or not the circuit design specifies an attribute that activates folding of the MAC logic.

13. The method of claim 1, further comprising:
generating implementation data from the circuit design having the one instance of the pipelined MAC logic; and
making an integrated circuit using the implementation data.

14. A system comprising:
a processor;
a memory arrangement coupled to the processor, wherein the memory arrangement is configured with instructions and in response to execution of the instructions, the processor performs operations including:
recognizing a first instance and a second instance of multiply-and-accumulate (MAC) logic in a circuit design, the first instance inputting first data signals and the second instance inputting second data signals;
replacing the first instance and the second instance of the MAC logic in the circuit design with one instance of pipelined MAC logic;
configuring the one instance of the pipelined MAC logic to:
input the first data signals and the second data signals to the one instance of the pipelined MAC logic at a first clock rate,
switch between selection of the first data signals and the second data signals at a second clock rate that is double the first clock rate,
pipeline at the second clock rate, selected data signals of the first data signals and the second data signals, and
capture intermediate results generated by the one instance of the pipelined MAC logic at the second clock rate; and
configuring a register to capture output of the pipelined MAC logic at the first clock rate.

15. The system of claim 14, wherein:
the instructions for recognizing include instructions for determining whether or not the circuit design accumulates output of the first instance of the MAC logic with output of the second instance of the MAC logic; and
the instructions for replacing include instructions for replacing the first instance and the second instance of the MAC logic with the one instance of the pipelined MAC logic in response to determining that the circuit design accumulates output of the first instance of the MAC logic with output of the second instance of the MAC logic.

16. The system of claim 15, wherein the instructions for recognizing include instructions for determining whether or not a first accumulate function by which the circuit design accumulates output of the first instance of the MAC logic with output of the second instance of the MAC logic is equivalent to a second accumulate function implemented by the first instance of the MAC logic and to a third accumulate function of the second instance of the MAC logic.

17. The system of claim 16, wherein the first accumulate function is a commutative and associative function.

18. The system of claim 16 wherein:
the first instance of the MAC logic specifies a first register that captures output of a multiplication circuit of the first instance of the MAC logic and a second register that captures output of an accumulation circuit of the first instance of the MAC logic;
the second instance of the MAC logic specifies a third register that captures output of a multiplication circuit of the second instance of the MAC logic and a fourth register that captures output of an accumulation circuit of the second instance of the MAC logic; and
the instructions for the recognizing include instructions for determining whether or not the first register, the second register, the third register, and the fourth register share an enable signal and a reset signal.

19. The system of claim 18 wherein:
the one instance of the pipelined MAC logic includes a multiplication circuit, a fifth register that captures output of the multiplication circuit, an accumulation circuit, and a sixth register that captures output of the accumulation circuit and that is responsive to the enable signal and the reset signal;
the instructions for the configuring the one instance of the pipelined MAC logic includes instructions for configuring the one instance of the pipelined MAC logic to:
pipeline the enable signal to the sixth register through a seventh register clocked at the second clock rate; and
pipeline the reset signal to the sixth register through an eighth register clocked at the second clock rate.

20. The system of claim 19, wherein:
the instructions for the configuring the one instance of the pipelined MAC logic include instructions for configuring the one instance of the pipelined MAC logic to:
pipeline the enable signal to the fifth register through the seventh register; and
pipeline the reset signal to the fifth register through a ninth register clocked at the first clock rate.

\* \* \* \* \*